(12) United States Patent
Bouvet

(10) Patent No.: US 11,601,310 B2
(45) Date of Patent: *Mar. 7, 2023

(54) METHOD AND DEVICE FOR DETECTING THE POSSIBLE PRESENCE OF AT LEAST ONE DIGITAL PATTERN WITHIN A SIGNAL

(71) Applicant: STMicroelectronics (Rousset) SAS, Rousset (FR)

(72) Inventor: Yoann Bouvet, Opio (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/580,000

(22) Filed: Jan. 20, 2022

(65) Prior Publication Data

US 2022/0141060 A1 May 5, 2022

Related U.S. Application Data

(63) Continuation of application No. 17/182,957, filed on Feb. 23, 2021, now Pat. No. 11,265,192.

(30) Foreign Application Priority Data

Mar. 9, 2020 (FR) ..................................... 2002311

(51) Int. Cl.
*H04L 27/233* (2006.01)
*H04L 27/26* (2006.01)
*H04L 27/00* (2006.01)

(52) U.S. Cl.
CPC ...... *H04L 27/2338* (2013.01); *H04L 27/2657* (2013.01); *H04L 27/2675* (2013.01); *H04L 2027/0095* (2013.01)

(58) Field of Classification Search
CPC ............ H04L 27/2338; H04L 27/2657; H04L 27/2675; H04L 2027/0095; H04L 27/06; H03K 5/19

(Continued)

(56) References Cited

U.S. PATENT DOCUMENTS 4,686,690 A 8/1987 Sato
5,123,013 A 6/1992 Hirayama
(Continued)

OTHER PUBLICATIONS

Jiang, Wenchao et al., "Transparent cross-technology communication over data traffic", IEEE Conference on Computer Communications, May 1, 2017, pp. 1-9, XP033160459, DOI: 10.1109/INFOCOM.2017.8057086.

(Continued)

*Primary Examiner* — Don N Vo
(74) *Attorney, Agent, or Firm* — Slater Matsil, LLP

(57) ABSTRACT

In accordance with an embodiment, a device configured to detect a presence of at least one digital pattern within a signal includes J memory circuits having respectively Nj memory locations; and processing circuitry comprising an accumulator configured to successively address the memory locations of the J memory circuits in a circular manner at frequency F and during an acquisition time, and successively accumulate and store values indicative of a signal intensity in parallel in the J addressed memory locations of the J memory circuits, and a detector configured to detect the possible presence of the at least one pattern.

20 Claims, 6 Drawing Sheets

(58) Field of Classification Search
USPC .......................................... 375/262, 366–368
See application file for complete search history.

(56) References Cited

U.S. PATENT DOCUMENTS

| | | |
|---|---|---|
| 5,461,426 A | 10/1995 | Limberg et al. |
| 6,470,142 B1 | 10/2002 | Isozaki et al. |
| 6,501,807 B1 | 12/2002 | Chieu et al. |
| 2007/0025738 A1* | 2/2007 | Moore ............... H04B 10/1149 398/189 |
| 2007/0025739 A1 | 2/2007 | Moore et al. |

OTHER PUBLICATIONS

Sankhe, Kunal et al., "Talking When No One is Listening: Piggybacking City-scale IoT Control Signals Over LTE 11", IEEE Conference on Computer Communications, Apr. 16, 2018, pp. 1547-1555, XP033418242. DOI: 10.1109/INFOCOM.2018.8485940.
Sigfox, "Monarch physical interface description and HW device requirements", Ref. MONDEV HWREQ Rev 1.2., Aug. 2, 2018, pp. 1-14, XP055749853.
STMicroelectronics, "Long-range wireless STM32WL microcontrollers", STM32WL Series, ST life.augmented, http://www.st.om/en/microcontrollers-microprocessors/stm32wl-series.html, Jan. 6, 2021, 4 pages.
Xu, Rongtao, et al., "Design and prototyping of low-power wide area networks for critical infrastructure monitoring", The Institution of Engineering and Technology, GB, vol. 11, No. 6, Apr. 20, 2017, pp. 823-830. XP006077794, ISSN: 1751-8628. DOI: 10.1049/IET-COM.2016.0853.

\* cited by examiner

| RC | Carrier frequency FP | 1st pattern | 2nd pattern |
|---|---|---|---|
| RC1 | 869.505 MHz | MTFR1 | MTFR2 |
| RC2 | 905.180 MHz | MTFR1 | MTFR2 |
| RC3 | 922.250 MHz | MTFR1 | MTFR2 |
| RC4 | 922.250 MHz | MTFR2 | MTFR3 |
| RC5 | 922.250 MHz | MTFR1 | MTFR3 |
| RC6 | 865.250 MHz | MTFR1 | MTFR3 |

METHOD AND DEVICE FOR DETECTING THE POSSIBLE PRESENCE OF AT LEAST ONE DIGITAL PATTERN WITHIN A SIGNAL

This application is a continuation of U.S. patent application Ser. No. 17/182,957, filed Feb. 23, 2021, which application claims the benefit of French Patent Application No. 2002311, filed on Mar. 9, 2020, which applications are hereby incorporated herein by reference in its entirety.

TECHNICAL FIELD

Implementations of the invention relate to a method and device for detecting the possible presence of at least one digital pattern within a signal.

BACKGROUND

One particularly interesting application of the invention relates to the analysis of a beacon signal received by a connected object of a network of connected objects deployed by the telecommunications operator Sigfox, so as to determine the Sigfox radio configuration (Sigfox RC) applicable to this connected object. This radio configuration corresponds in practice to a geographic region.

The Sigfox network of connected objects, which is well known to a person skilled in the art, is a worldwide narrowband network with a low data rate and a long range allowing objects, for example simple sensors, to communicate with a transmitter or base station. The frequency band is in the sub-gigahertz range.

Before an object can enter into dialogue with a base station, it must know in which region it is operating. To do this, before any dialogue with a base station, the object must receive and analyze a beacon signal emitted by the base station, because it is this beacon signal which will indicate to the object which region it is in and thus in which region it will be required to operate.

This beacon signal sent by the Sigfox network is called the "Monarch" signal. The "Monarch" beacon signal is emitted at the RF frequency defined by the region in which the emitter is situated. This beacon signal is a carrier modulated by an on-off keying modulation, by a succession of two repetitive digital patterns. These two patterns are chosen from a group of several different patterns, typically three.

The carrier frequency, also called the central frequency, is one of a list of possible "Monarch" central frequencies. The central frequency as well as the two patterns define the radio configuration or region in which the base station is situated.

An object scans all the possible "Monarch" central frequencies to search for the first pattern. Once it finds the first pattern at the correct central frequency, it will search for the second pattern at the same central frequency. Once it has found the second pattern, the object then knows the central frequency (carrier frequency) and the two patterns, and consequently it knows the region in which it is located.

As indicated above, the "Monarch" beacon signal is modulated by an OOK modulation. Consequently, a connected object which does not include an OOK demodulator cannot currently demodulate a signal and thus detect the digital patterns contained in the signal.

However, implementing an OOK demodulator has drawbacks, for example in terms of complexity and/or space requirement, which can prove difficult to reconcile in certain applications, for example with simple architectures of simple sensors.

SUMMARY

In accordance with an embodiment, a method detects a possible presence of at least one digital pattern within a signal. The at least one pattern belongs to a group of J reference patterns, J being greater than or equal to 2, comprising respectively Nj samples sequenced at a frequency F, Nj being a different integer for each reference pattern, and the J integers Nj being co-prime integers. The signal originates from a carrier modulated by the Nj samples of the at least one digital pattern by an on-off keying modulation at frequency F for a modulation period during which the pattern repeats at a frequency equal to F/Nj. Each reference pattern has a single sample authorizing an emission of the carrier and Nj−1 logic samples prevent the emission of the carrier. The method includes receiving the signal and processing the received signal. Processing includes (a) at frequency F and during an acquisition time, successive circular addressing of memory locations of J memory circuits having respectively Nj memory locations, and successive accumulative storing of values indicative of a signal intensity, in parallel in the J addressed memory locations of the J memory circuits, and (b) detecting the possible presence of the at least one pattern comprising analyzing cumulative values contained in the memory locations of the J memory circuits.

In accordance with another embodiment, a device for detecting a possible presence of at least one digital pattern within a signal. The at least one pattern belongs to a group of J reference patterns, J being greater than or equal to 2, comprising respectively Nj samples sequenced at a frequency F, Nj being a different integer for each reference pattern, and the J integers Nj being co-prime integers. The signal originates from a carrier modulated by the Nj samples of the at least one digital pattern by an on-off keying modulation at frequency F for a modulation period during which the pattern repeats at a frequency equal to F/Nj. Each reference pattern has a single sample authorizing an emission of the carrier and Nj−1 logic samples prevent the emission of the carrier. The device includes an input interface configured to receive the signal; J memory circuits having respectively Nj memory locations; and processing circuitry comprising: an accumulator configured to successively address the memory locations of the J memory circuits in a circular manner at frequency F and during an acquisition time, and successively accumulate and store values indicative of a signal intensity in parallel in the J addressed memory locations of the J memory circuits, and a detector configured to detect the possible presence of the at least one pattern, wherein the detector comprises an analyzer configured to analyze the accumulated values contained in the memory locations of the J memory circuits.

In accordance, with a further embodiment, a connected object includes a device configured to detect a presence of at least one digital pattern within a signal. The device includes: an input interface configured to receive the signal; J memory circuits having respectively Nj memory locations; and processing circuitry comprising: an accumulator configured to successively address the memory locations of the J memory circuits in a circular manner at frequency F and during an acquisition time, and successively accumulate and store values indicative of a signal intensity in parallel in the J addressed memory locations of the J memory circuits, and a detector configured to detect the possible presence of the at least one pattern, wherein the detector comprises an analyzer configured to analyze the accumulated values contained in the memory locations of the J memory circuits, wherein the at least one pattern belongs to a group of J reference patterns, J being greater than or equal to 2, comprising respectively Nj samples sequenced at a frequency F, Nj being a different integer for each reference pattern, and the J integers Nj being co-prime integers.

BRIEF DESCRIPTION OF THE DRAWINGS

Other advantages and features of the invention shall become evident from the detailed description of embodiments and implementations that are in no way limiting, and from the enclosed drawings in which.

DETAILED DESCRIPTION OF ILLUSTRATIVE EMBODIMENTS

Figure 1:
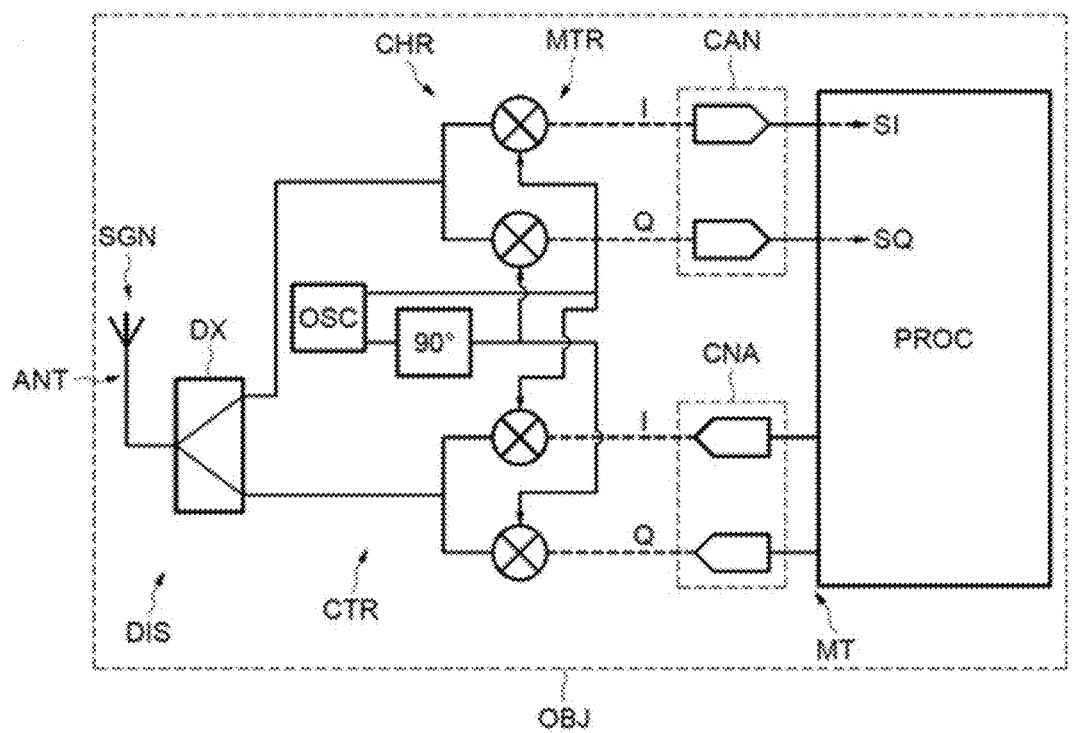
FIG. 1 illustrates a reference object according to an embodiment.

Implementations of the invention relate to the processing of signals that are modulated, for example, by an on-off keying modulation, known to a person skilled in the art under the acronym OOK, and in particular detection of the possible presence within these signals of one or more digital patterns modulating these signals.

There is a need to be able to detect one or more digital patterns modulating a carrier using an OOK modulation, for example, but not limited to, a beacon signal of the Sigfox network, without using an OOK demodulator. In this regard, the inventor has observed that the number of samples of modulating digital patterns of the Sigfox beacon signal, are co-prime integers.

Based on this observation, it is proposed according to one implementation and embodiment, to use as many circularly addressable memory circuits as there are possible modulating digital patterns and having respective sizes corresponding to those of the patterns; to address these memory circuits, in a circular manner, at the rhythm of a timing signal having the modulation frequency; to extract values, at the rhythm of this timing signal, which are indicative of the intensity of the signal (RSSI values: Received Signal Strength Intensity); to store each extracted value, in parallel in the addressed memory locations of the memory circuits, cumulating this value with the content of the corresponding memory location; and to repeat these operations for an acquisition time much longer than the time required to fully address the largest memory circuits.

In various embodiments, the memory circuits describes herein may be implemented using memory structures known in the art, including, but not limited to as registers, circular buffer memories, SRAM, DRAM, and the like. The memory circuits may be implemented, for example, using multiple memory circuits, such as multiple registers, or may be implemented using a single addressable memory.

Each pattern having a single sample, for example a bit equal to 1, modulating the carrier at "ON" (the other samples, for example bits equal to 0, modulating the carrier "at OFF"), only the memory circuits having a size corresponding to that of the pattern effectively present in the signal during the acquisition time, will see a single and same memory location always receive, during the acquisition time, the intensity value corresponding to the bit equal to 1 and therefore present a cumulative "peak" value (corresponding to the signal), the other memory locations only storing noise.

Regarding the other memory circuits, none of their memory locations will present a peak with respect to the others because the intensity value corresponding to the bit equal to 1 will repeat almost uniformly over all the memory locations during the acquisition time.

An analysis of the contents of the memory locations of the memory circuits then makes it possible to determine the memory circuits having the signal peak and thus deduce therefrom which pattern is present in the received signal.

Furthermore, unlike an OOK demodulator which would deliver the effective logic values 0 or 1 of the received bits of the pattern ("hard bits") in order to then take the decision on the nature of the received pattern, it is proposed here to simply use the RRSI values ("soft bits"), including the signal and the noise, in combination with the circular addressing of the memory circuits, in order to then take the decision on the nature of the received pattern.

Thus, according to one aspect, a method is proposed for detecting the possible presence of at least one digital pattern within a signal.

The at least one pattern belongs to a group of J reference patterns, J being greater than or equal to 2, respectively comprising Nj samples sequenced at a frequency F, Nj being a different integer for each reference pattern, and the J integers Nj being co-prime integers.

The signal originates from a carrier modulated by the Nj samples of the at least one digital pattern, by an on-off keying modulation (OOK modulation) at the frequency F for a modulation period during which the pattern repeats at a frequency equal to F/Nj.

Each reference pattern has a single logic sample, for example a bit equal to 1, authorizing the emission of the carrier and Nj−1 logic samples, for example zero bits, preventing the emission of the carrier.

The method according to this aspect comprises receiving the signal and processing the received signal. In an embodiment, the processing comprises: (a) at frequency F and during an acquisition time, successive circular addressing of the memory locations of J memory circuits having respectively Nj memory locations, and successive accumulative storing of values indicative of the signal intensity, in parallel in the J addressed memory locations of the J memory circuits; and (b) detecting the possible presence of the at least one pattern comprising an analysis of the cumulative values contained in the memory locations of the J memory circuits.

When the received signal contains effectively one pattern, for example when the received signal is analyzed in a time window in which the pattern is present, it could be sufficient to label the memory location of the memory circuits containing the largest cumulative value in order to deduce which of the possible reference patterns has been emitted.

However, in certain applications, the pattern or patterns can only be emitted in periodic time windows and at random times. This is the case, for example, for the beacon signal of the Sigfox network, which has a length of 400 ms and which is emitted at a random time during a 10 second window repeating every five minutes. Thus, depending on the times, the analysis of the signal leads to the detection of an absence of pattern in the received signal because nothing but the noise is received. Thus, in order to minimize or even remove the risk of detecting "false positives", a signal-to-noise ratio may advantageously be taken into account.

More precisely, according to one implementation, the analysis of the cumulative values comprises, for each of the J memory circuits, a determination of the memory location for which the cumulative value is largest, a determination of the average of the cumulative values contained in the other memory locations, obtaining a difference between a value taken from the largest cumulative value and the average, and a comparison of the difference with a threshold.

In order to provide a unique threshold for each of the memory circuits, it is advantageous to use, in order to determine this difference, the largest cumulative value, normalized by the number of times that the corresponding memory circuit has been fully addressed, and the average of the cumulative values contained in the other memory locations, normalized by the number of times that the corresponding memory circuit has been fully addressed.

Obtaining each of the J differences less than the corresponding threshold, is representative of the absence of any pattern in the signal, whereas obtaining one of the J differences greater than the corresponding threshold is representative of the presence in the signal of the pattern having the number of samples equal to the number of memory locations of the memory circuits for which the difference greater than the threshold has been obtained.

In order to obtain a sufficiently reliable detection, the acquisition time is chosen to be at least 10 times longer than the duration of the reference pattern having the largest number of samples. Thus, for example, for the "Monarch" beacon signal, an acquisition time of 19 ms could be taken, for example. The carrier is, for example, a periodic signal, for example of sinusoidal shape, having a carrier frequency.

In an embodiment, processing then further comprises, according to one implementation, prior to steps (a) and (b), (c) a transposition of the received signal into baseband on two channels in phase quadrature using the carrier frequency; and (d) an analogue-to-digital conversion of the two signals in phase quadrature so as to obtain two digital signals in baseband. Step (a) may include a determination of the values indicative of the intensity of the signal from the digital signals in baseband.

In certain applications, such as in the Sigfox network for example, J is greater than two, for example equal to 3 In other words, the pattern can be chosen from among more than two reference patterns. Whether J is greater than 2 or equal to 2, the signal can, according to an implementation mode applicable, in particular, to the Sigfox network, originate from the carrier modulated by an on-off keying modulation through a first digital pattern belonging to the group of J reference patterns during a first modulation period, and then by a second digital pattern belonging to the group of J reference patterns during a second modulation period. Then, after having detected the presence of the first pattern, the processing is implemented in order to detect the possible presence of the second pattern. Of course, even though in practice the first pattern and the second pattern are different, they could in theory be identical.

In certain applications, the carrier frequency could be unique and fixed. However, in other possible applications, such as in the Sigfox network, the carrier frequency can belong to a set of different frequencies.

The processing therefore advantageously includes an implementation of the steps (a), (b), (c) and (d) for each of the different frequencies so as to detect the presence of the at least one pattern and the carrier frequency. In certain situations, for example when two possible carrier frequencies are close to one another, it is possible to obtain several differences (between the largest normalized cumulative values and the normalized averages) greater than the corresponding thresholds. In such a case, the largest is selected in order to designate the at least one pattern.

According to an implementation mode, after having detected the presence of the first pattern and the frequency of the carrier, the processing of the detection of the possible presence of the second pattern comprises implementing step (c) with the carrier frequency determined during the detection of the first pattern.

According to a particular implementation mode, applicable for example to the "Monarch" beacon signal used in the network of connected objects deployed by the telecommunications operator Sigfox, J is equal to 3 and the three integers Nj are respectively equal to 11, 13 and 16.

According to another aspect, a device is proposed for detecting the possible presence of at least one digital pattern within a signal, the at least one pattern belonging to a group of J reference patterns, J being greater than or equal to 2, comprising respectively Nj samples sequenced at a frequency F Nj being a different integer for each reference pattern, and the J integers Nj being co-prime integers, the signal originating from a carrier modulated by the Nj samples of the at least one digital pattern by an on-off keying modulation at frequency F for a modulation period during which the pattern repeats at a frequency equal to F/Nj, each reference pattern having a single sample authorizing the emission of the carrier and Nj−1 logic samples preventing the emission of the carrier.

The device according to this aspect comprises an input interface configured to receive the signal, J memory circuits having, respectively, Nj memory locations, and the processing circuitry includes an accumulator configured to carry out, at frequency F and during an acquisition time, successive addressing, in a circular manner, of the memory locations of the J memory circuits, and the successive accumulative storage of values indicative of the signal intensity, in parallel in the J addressed memory locations of the J memory circuits; and a detector configured to carry out a detection of the possible presence of the at least one pattern comprising an analyzer configured to carry out an analysis of the cumulative values contained in the memory locations of the J memory circuits.

According to an embodiment, the analyzer is configured to carry out, for each of the J memory circuits, a determination of the memory location for which the cumulative value is largest, a determination of the average of the cumulative values contained in the other memory locations, obtaining a difference between a value taken from the largest cumulative value and the average, and a comparison of the difference with a threshold.

According to an embodiment, the value is the largest cumulative value normalized by the number of times when the corresponding memory circuit has been fully addressed, and the average is the average of the cumulative values normalized by the number of times that the corresponding memory circuit has been fully addressed.

According to an embodiment, obtaining each of the J differences less than the corresponding threshold is representative of the absence of any pattern in the signal. According to an embodiment, obtaining one of the J differences greater than the corresponding threshold is representative of the presence in the signal of the pattern having the number of samples equal to the number of memory locations of the memory circuits for which the difference greater than the threshold has been obtained. According to an embodiment, the acquisition time is at least 10 times longer than the duration of the reference pattern having the largest number of samples.

According to an embodiment, the carrier is a periodic signal having a carrier frequency, and the processing circuitry includes a transposer configured to carry out a transposition of the received signal into baseband on two channels in phase quadrature using the carrier frequency, and a conversion stage configured to carry out an analogue to digital conversion of two signals in phase quadrature so as to obtain two digital signals in baseband, and the analyzer is configured to carry out a determination of the values indicative of the intensity of the signal, from the digital signals in baseband.

According to an embodiment the signal originates from the carrier modulated by an on-off keying modulation by a first digital pattern belonging to the group of J reference patterns during a first modulation period, and then by a second digital pattern belonging to the group of J reference patterns during a second modulation period; and the device further comprises a controller configured to, after detection of the presence of the first pattern, to activate processing circuitry for detecting the possible presence of the second pattern.

According to an embodiment, the carrier frequency belongs to a set of different frequencies, and the controller is configured to activate the processing circuitry for each of the different frequencies so as to detect the presence of the at least one pattern and the frequency of the carrier.

According to an embodiment, in the event of obtaining several differences greater than the corresponding thresholds, the detector comprising the selector is configured to select the largest to designate the at least one pattern.

According to an embodiment, after having detected the presence of the first pattern and the frequency of the carrier, the controller is configured to activate the processing circuitry for the carrier frequency so as to detect the possible presence of the second pattern.

According to an embodiment, J is equal to 3 and the three integers Nj are respectively equal to 11, 13 and 16. The signal may be, for example, a beacon signal used in the network of connected objects deployed by the telecommunications operator Sigfox. According to an aspect, a connected object is proposed incorporating a device such as defined above.

In accordance with some embodiments, as many circularly addressable memory circuits are used as there are possible modulating digital patterns and having respective sizes corresponding to those of the patterns. These sizes are co-primes. These memory circuits are addressed, in a circular manner, at the rhythm of a timing signal having the modulation frequency. Values are extracted at the rhythm of this timing signal which are indicative of the intensity of the signal. Each extracted value is stored in parallel in addressed memory locations of the memory circuits, by cumulating this value with the content of the corresponding memory location, and these operations are repeated for an acquisition time much longer than the time required to fully address the largest memory circuits. An analysis of the contents of the memory locations of the memory circuits makes it possible to detect the possible presence of a pattern within the signal.

In FIG. 1, the reference OBJ designates a connected object, for example a suitcase, belonging to a network of connected objects, for example but not limited to the network of connected objects deployed by the telecommunications operator Sigfox.

This object incorporates a device DIS for detecting the possible presence of at least one digital pattern within an emitted signal SGN, for example a beacon signal, such as the "Monarch" beacon signal emitted by a base station of the Sigfox network.

The features of the Sigfox network and of the "Monarch" beacon signal are well known to a person skilled in the art.

Such a person could, for example, refer for all practical purposes to the document entitled "Monarch physical interface description and hardware device requirements", ver. 1.2, dated 2 Aug. 2018 and available on the Internet via the following link: https://www.disk91.com/wp-ccontent/uploads/2019/9/Monarch_physical_interface_description_and_device_HW_require ments_v1.2_external.pdf.

Figure 3:
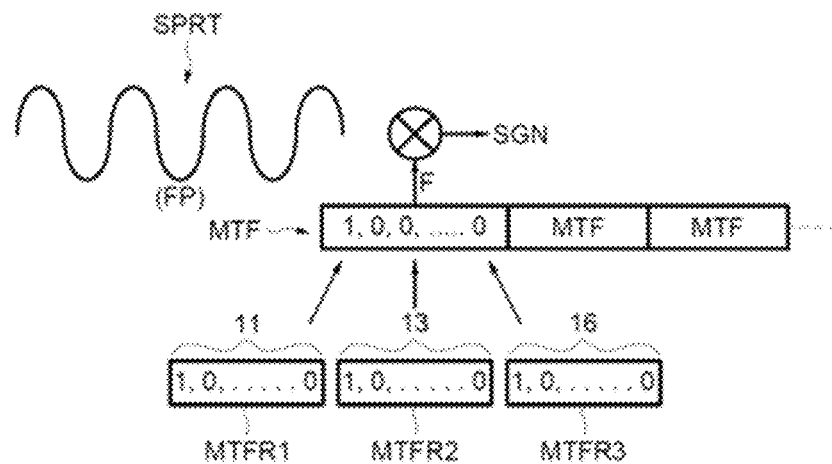
FIG. 3 illustrates a processing method according to an embodiment.

As illustrated in FIG. 3, the pattern MTF belongs, in this example, to a group of J reference patterns, in this case 3 reference patterns MTFR1, MTFR2 and MTFR3. The pattern MTFR1 comprises 11 samples; the pattern MTFR2 comprises 13 samples; the pattern MTFR3 comprises 16 samples; the 3 integers 11, 13 and 16 are co-prime integers; and the pattern MTF can therefore be one of these reference patterns and thus comprise 11, 13 or 16 samples sequenced at a frequency F, for example 16,384 Hz.

The signal SGN originates from a carrier SPRT, in this case a sinusoidal carrier, having a carrier frequency FP modulated by the N digital pattern samples MTF through an on-off keying modulation (OOK modulation) at the modulation frequency F (in this case 16,384 Hz) during a modulation period during which the pattern repeats at a frequency equal to F/N.

Among the Nj samples of each reference pattern MTFRj (j=1 to 3), a single logic sample (in this case a bit equal to 1) authorizes the emission of the carrier, the Nj-1 (10, 12 or 15) other logic samples (in this case zero bits) prevent the emission of the carrier.

Referring again to FIG. 1, it can be seen that the device DIS comprises an input interface, in this case an antenna ANT configured to receive the signal SGN, and processing circuitry MT.

These processing circuitry comprises, in particular, within a receive chain CHR, connected to the antenna via a duplexer DX, transposer MTR of conventional construction and known per se, configured to carry out a transposition of the received signal I and QSGN into baseband on two channels in phase quadrature using the carrier frequency FP. Transposer MTR may be implemented using, for example, a quadrature demodulator circuit known in the art, such as such the one illustrated in FIG. 1 that includes four mixers and a 90° phase shifter. In this respect, an oscillator OSC delivers the transposition signal at the frequency FP to two mixers (one of the transpositions signals being phase-shifted by 90°.

The processing circuitry preferably also comprises a filter configured to carry out a channel filtering of the frequency band greater than frequency F (in this case 16,384 Hz).

The processing circuitry also comprises a conversion stage CAN configured to carry out an analogue-to-digital conversion of two filtered quadrature phase signals so as to obtain two digital signals in baseband, SI and SQ.

A processor PROC is configured to carry out processing in baseband. This processor PROC may be implemented using a processor executing software, such as a microcontroller, a microprocessor or other programmable processing circuit known in the art. The processor may include a non-transitory computer readable medium that stores a set of executable instructions that define the processing functions described herein. Processor PROC may be a part of the processing circuitry MT.

Figure 2:
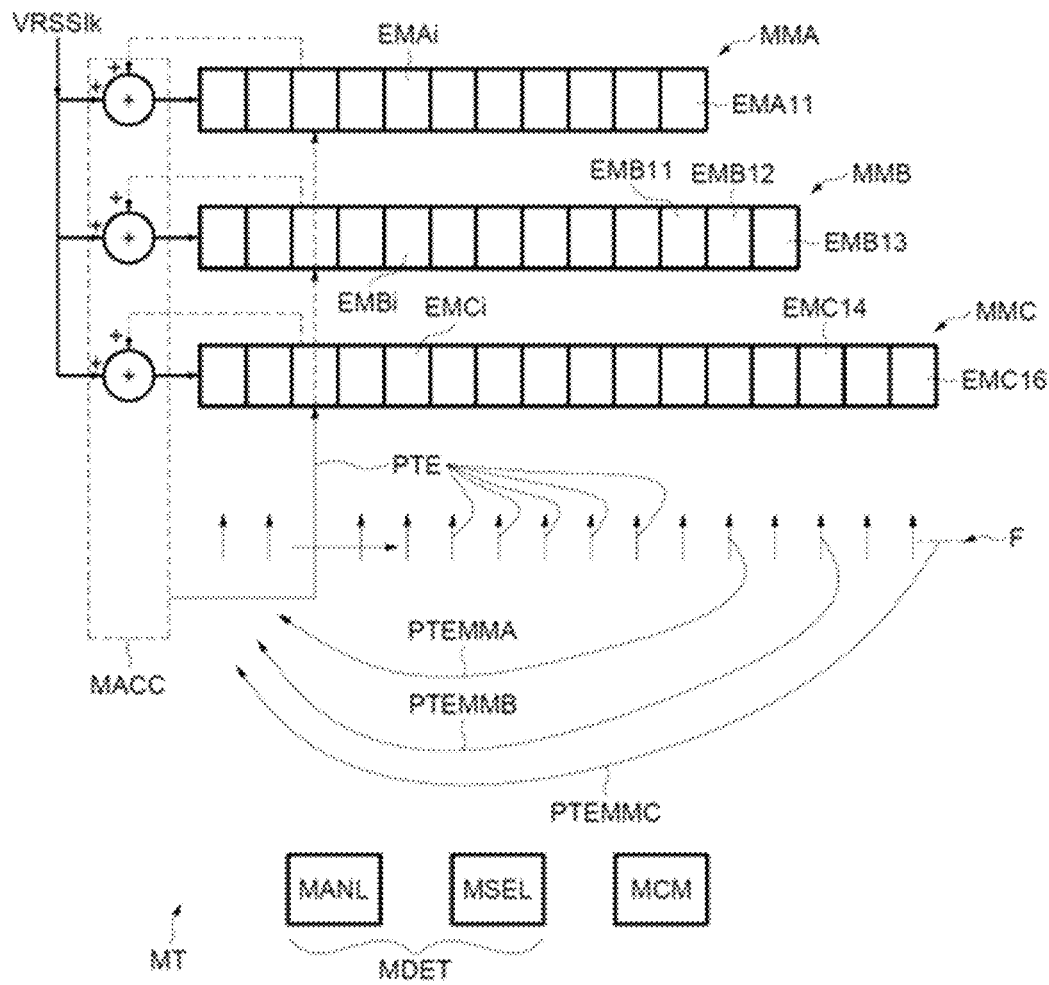
FIG. 2 illustrates processing circuitry according to an embodiment.

As illustrated in FIG. 2, the device comprises as many memory circuits as there are reference patterns.

The device therefore comprises, in this case, three (J=3) memory circuits MMA, MMB and MMC having respectively Nj memory locations.

The memory circuit MMA comprises 11 memory locations EMAi (i=1 to 11), which are associated with the reference pattern MTFR1.

The memory circuit MMB comprises 13 memory locations EMBi (i=1 to 13), which are associated with the reference pattern MTFR2.

The memory circuit MMC comprises 16 memory locations EMCi (i=1 to 16), which are associated with the reference pattern MTFR3.

The processing circuitry MT also comprises an accumulator MACC configured to carry out, at frequency F and for an acquisition time, for example 19 ms, successive addressing, in a circular manner, of the memory locations of the J memory circuits, and the successive accumulative storage of values VRSSIk indicative of the intensity of the signal SGN, in parallel in the J addressed memory locations of the J memory circuits. The accumulator MACC may be implemented using accumulator circuits known in the art, such as one or more digital adders. In some embodiments accumulator MACC may be implanted using a processor executing software a configured to perform an accumulation function.

Figure 4:
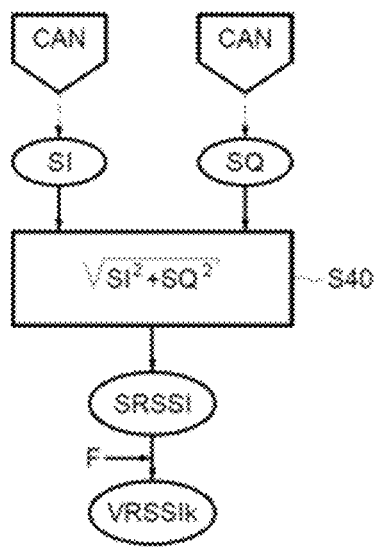
FIG. 4 illustrates a processing method according to an embodiment.

More precisely, as illustrated in FIG. 4, based on the digital signals in baseband SI and SQ, a signal SRSSI is determined, for example by taking (step S40) square roots of the sums of the squared values of the samples of the digital signals SI and SQ, from which the modulation frequency F (in this case 16,384 Hz) is extracted, the values VRSSIk being indicative of the intensity of the signal SGN. This determination of the values VRSSIk is carried out by the analyzer MANL (FIG. 2) incorporated in the processor PROC and forming part of the detector MDET for detecting the possible presence of a pattern in the signal SGN. The detector MDET, analyzer MANL and/or selector MCM described below may be implemented using a processor executing software and/or may be implemented using dedicated digital logic or hardware.

As illustrated in FIG. 2, each value VRSSIk is stored in parallel in the 3 memory circuits MMA, MMB and MMC in the memory locations addressed, for example, by a write pointer PTEMMA, PTEMMB, PTEMMC associated with each memory circuit.

The current value VRSSIk stored in a memory location is accumulated with the content of this memory location resulting from previous storages.

Each pointer PTE moves at the frequency F in order to address all the memory locations of the memory circuits.

After the write pointer has pointed to the last memory location of a memory circuit, it will point in the next move to the first memory location of this memory circuit.

This is the case for the pointer PTEMMB when the 11th memory location EMA11 of memory circuit MMA has been addressed.

This is the case for the pointer PTEMMB when the 13th memory location EMB13 of memory circuit MMB has been addressed.

This is the case for the pointer PTEMMC when the 16th memory location EMC16 of memory circuit MMC has been addressed.

Physically, these memory circuits can be of any known construction, for example circular buffer memories.

In order to detect the possible presence of the at least one pattern in the received signal SFN, the analyzer MANL is configured to analyze the cumulative values contained in the memory locations of the J memory circuits.

An example of this analysis is described in more detail with reference to FIG. 5.

In this respect, it should be noted that when a pattern corresponding to one of the reference patterns is present in the signal SGN, the value VRSSI corresponding to the carrier modulation by the bit of the pattern equal to 1 will, during the acquisition time, always accumulate in the same memory location of the memory circuits associated with this reference pattern.

On the other hand, this value VRSSI will be accumulated uniformly in all the memory locations of the other memory circuits, due to the co-prime nature of the numbers of memory locations, in this case 11, 13 and 16, of the memory circuits. In this regard, an acquisition time at least 10 times longer than the duration of the reference pattern having the largest number of samples is preferably chosen.

Figure 5:
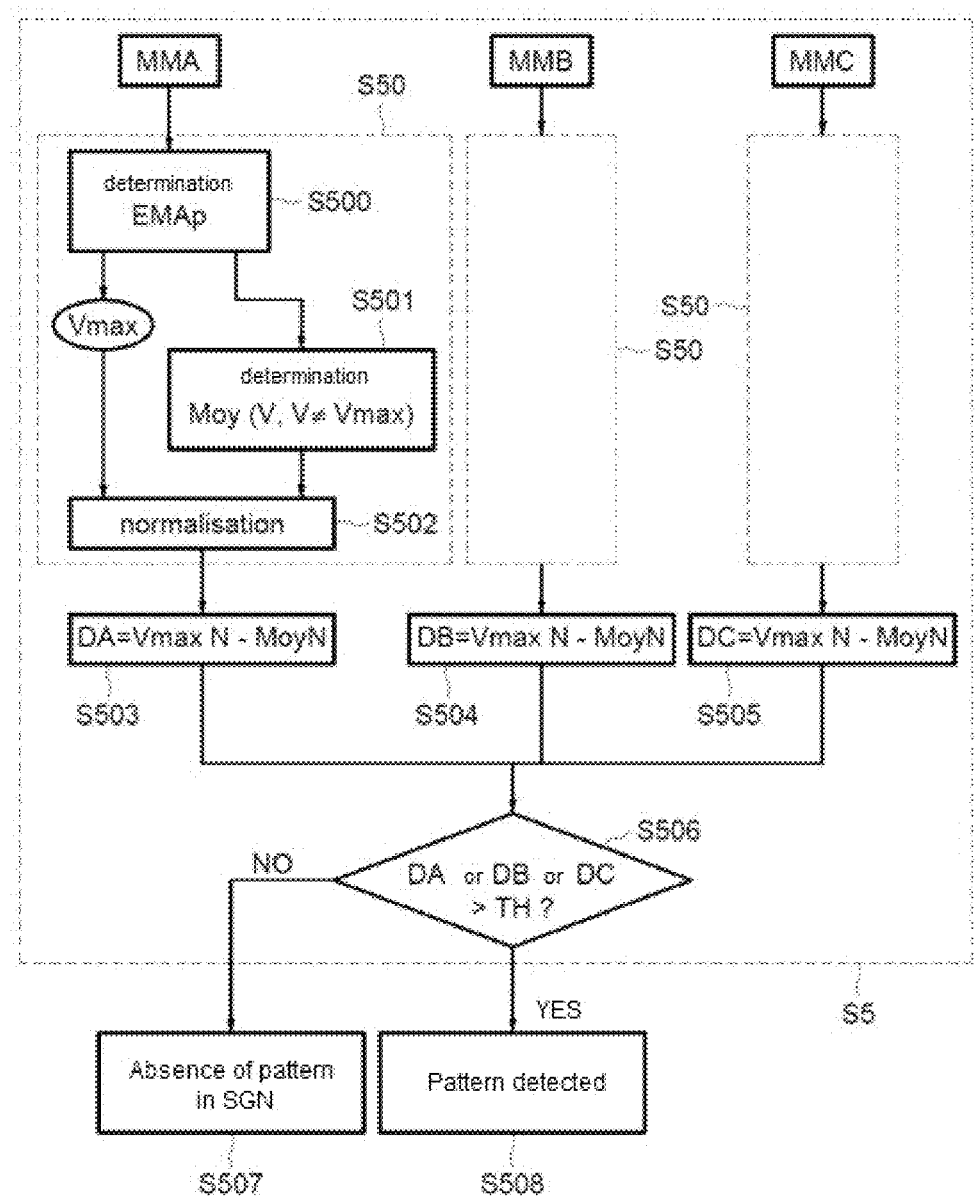
FIG. 5 illustrates an analysis method according to an embodiment.

As illustrated in FIG. 5, after the acquisition time, the analyzer is configured to carry out the group of operations S50 for each of the memory circuits. This will now be described in more detail for memory circuits MMA. More precisely, the analyzer determines (S500) the memory location EMAp for which the cumulative value Vmax is largest. They also determine S501 an average of the cumulative values contained in the other memory locations.

A normalization S502 is then carried out. More precisely, the value Vmax is (for example divided) by the number of times when the corresponding memory circuits, in this case memory circuits MMA, has been fully addressed during the acquisition time, so as to obtain the normalized value VmaxN. Similarly, the average obtained in step S501 is normalized (for example divided) by the number of times when the corresponding memory circuits, in this case memory circuits MMA, has been fully addressed, so as to obtain the normalized value MoyN.

Then the analyzer calculates (step 503) a difference DA between the normalized value VmaxN and the normalized average MoyN.

The analyzer also determines the differences DB and DC for the two other memory circuits MMB and MMC. The analyzer then compares these differences to a threshold TH (step S506).

Obtaining each of the differences less than the threshold TH is representative of the absence of any pattern in the signal (S5107). In other words, if all the differences are less than the threshold TH, it can be concluded that there is no pattern in the signal. On the other hand, obtaining one of the J differences greater than the corresponding threshold is representative of the presence in the signal of the pattern having the number of samples equal to the number of memory locations of the memory circuits for which the difference greater than the threshold has been obtained (step S508).

Figure 6:
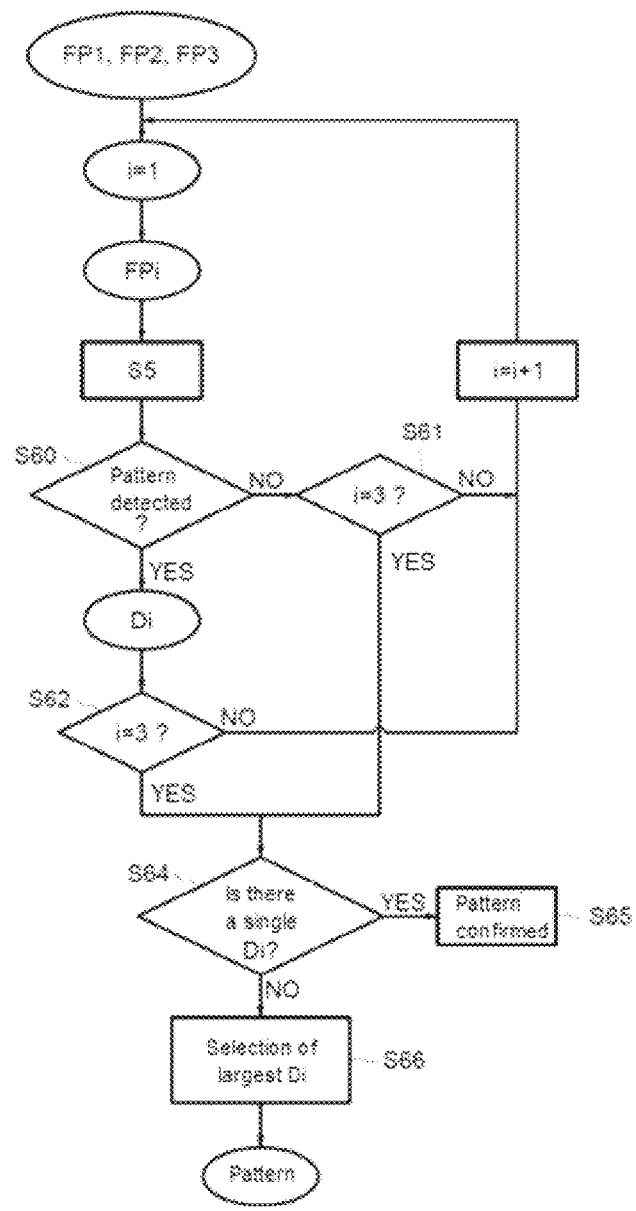
FIG. 6 illustrates a method according to an embodiment.

It is furthermore possible, as is the case for example for the "Monarch" beacon signal, that, as illustrated in FIG. 6, the carrier frequency belongs to a set of different frequencies, in this case three frequencies FP1, FP2 and FP3. Therefore, the device is intended to comprise controller MCM (FIG. 2), produced, for example, as software within the processor PROC, and configured to activate the processing circuitry for each of the different frequencies so as to detect the presence of the at least one pattern and the frequency of the carrier. In some embodiments, controller MCM may be implemented in hardware using, for example, dedicated digital logic or other controller circuitry known in the art.

More precisely, as illustrated in FIG. 6, for each possible carrier frequency FPi, the processing circuitry carry out all the operations designated in FIG. 5 by the global reference S5.

If no pattern is detected for the carrier frequency FPi and all the possible carrier frequencies have not been scanned (S6o and S61) then the set of operations S5 is repeated for the other possible carrier frequencies.

If in step S6o, a pattern has potentially been detected for a carrier frequency FPi, by obtaining a difference Di greater than the threshold TH, but all the possible carrier frequencies have not been explored (interrogation step S62 and answer NO), then the set of operations S5 is repeated for the other possible carrier frequencies in order to confirm the preceding detection or to refine this detection as will be explained below.

Then, in step S64, the analyzer tests for the presence of one or more obtained differences greater than the threshold. If a single difference Di greater than the threshold has been obtained for the frequency FPi, then the detected pattern is confirmed (step S65) and the carrier frequency is indeed the frequency FPi. However, it is possible, in particular when the carrier frequencies are close to one another, that several differences Di greater than the threshold are obtained for different carrier frequencies FPi. In this case, selector MSEL, forming part of the detector MDET (FIG. 2) select (S66) the largest difference, in order to designate the pattern and the corresponding carrier frequency.

It is possible that the signal SGN comprises several patterns successively. This is the case for example for the "Monarch" beacon signal of the Sigfox network, which has a length of 400 ms and which contains a first pattern of 362 ms followed by a second pattern of 32 ms. This beacon signal is emitted at a random time during a 10 second window repeating every five minutes. Each of these two patterns can be one of the three reference patterns MTFR1, MTFR2, MTFR3. Furthermore, several carrier frequencies or central frequencies FP are possible for this beacon signal.

Figures 7, 8:
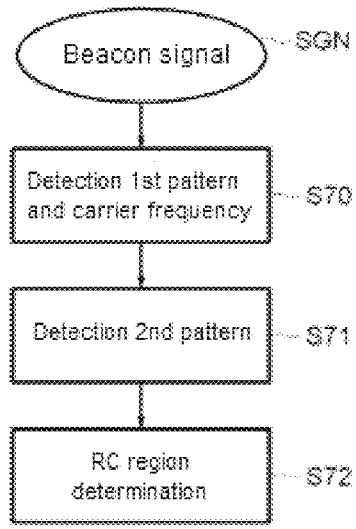
FIG. 7 illustrates a method according to an embodiment.
FIG. 8 illustrates a table of frequencies and patterns according to an embodiment.

It is possible to define, for example, as illustrated in the table of FIG. 8 and extracted from the above cited document, six radio configurations or regions RC1-RC6, each being defined by a central frequency and a combination of a first and a second pattern.

Thus, as illustrated in FIG. 7, when the signal SGN, for example the "Monarch" beacon signal includes several patterns to be detected, for example two patterns, the controller MCM activates the processing circuitry in order to detect the first pattern and the carrier frequency (step S70), then activate the processing circuitry in order to detect the second pattern (step S71) by using the carrier frequency found.

The processing circuitry thus determines the corresponding region RCi (step S72).

Once this configuration region is determined, the rest of the dialogue between the base station and the connected object is carried out in a conventional manner by a GFSK modulation/demodulation in the direction base station to object and by an FSK modulation/demodulation in the direction object to base station, by using within the object, the CTR emission system with analogue/digital stage DAC and upward transposition (FIG. 1).

What is claimed is:

1. A method for detecting a possible presence of at least one digital pattern within a signal, the at least one digital pattern belonging to a group of J reference patterns, J being greater than or equal to 2, comprising respectively Nj samples sequenced at a frequency F, Nj being a different integer for each reference pattern, the signal (SGN) originating from a carrier modulated by the Nj samples of the at least one digital pattern by an on-off keying modulation at frequency F for a modulation period during which the at least one digital pattern repeats at a frequency equal to F/Nj, and the samples of each reference pattern adjust an emission of the carrier, the method comprising:
receiving the signal; and
processing the received signal, processing comprising:
(a) at the frequency F and during an acquisition time, successive circular addressing of memory locations of J memory circuits having respectively Nj memory locations, and successive accumulative storing of values indicative of a signal intensity, in parallel in the J addressed memory locations of the J memory circuits, and
(b) detecting the possible presence of the at least one pattern, detecting comprising analyzing cumulative values contained in the memory locations of the J memory circuits.

2. The method according to claim 1, wherein each reference pattern has a single sample authorizing an emission of the carrier and Nj−1 logic samples preventing the emission of the carrier.

3. The method according to claim 1, wherein J integers Nj are co-prime integers.

4. The method according to claim 1, wherein the analyzing comprises, for each of the J memory circuits, determining the memory location for which the cumulative value is largest, determining the average of the cumulative values contained in other memory locations, obtaining a difference between a value taken from the largest cumulative value and the average, and comparing the difference with a corresponding threshold, wherein J differences corresponding to the J memory circuits are obtained.

5. The method according to claim 4, wherein the value is the largest cumulative value normalized by a number of times when a corresponding memory circuit of the J memory circuits has been fully addressed, and the average is the average of the cumulative values contained in the other memory locations, normalized by the number of times when the corresponding memory circuit has been fully addressed.

6. The method according to claim 4, wherein:
obtaining each of the J differences less than the corresponding threshold represents an absence of any pattern in the signal; and
obtaining one of the J differences greater than the corresponding threshold represents a presence in the signal of a pattern having a number of samples equal to a number of memory locations of the memory circuit for which the difference greater than the threshold has been obtained.

7. The method according to claim 1, wherein the carrier is a periodic signal having a carrier frequency (FP), the processing further comprising prior to steps (a) and (b),
c) transposing the received signal into baseband on two channels in phase quadrature using the carrier frequency, and d) performing an analogue-to-digital conversion of the two signals in phase quadrature so as to obtain two digital signals in baseband, wherein step (a) comprises determining the values indicative of the intensity of the signal from the digital signals in baseband.

8. The method according to claim 7, wherein the carrier frequency belongs to a set of different frequencies, and the processing comprises implementing steps (a), (b), (c) and (d) for each of the different frequencies so as to detect the possible presence of the at least one digital pattern and the frequency of the carrier.

9. The method according to claim 8, wherein in the event of obtaining several differences greater than the corresponding thresholds, the largest is selected to designate the at least one digital pattern.

10. A device for detecting a possible presence of at least one digital pattern within a signal, the at least one digital pattern belonging to a group of J reference patterns, J being greater than or equal to 2, comprising respectively Nj samples sequenced at a frequency F, Nj being a different integer for each reference pattern, the signal originating from a carrier modulated by the Nj samples of the at least one digital pattern by an on-off keying modulation at frequency F for any modulation period during which the at least one digital pattern repeats at a frequency equal to F/Nj, and the samples of each reference pattern adjust an emission of the carrier, the device comprising:
an input interface configured to receive the signal;
J memory circuits having respectively Nj memory locations; and
processing circuitry comprising:
an accumulator configured to
successively address the memory locations of the J memory circuits in a circular manner at the frequency F and during an acquisition time, and
successively accumulate and store values indicative of a signal intensity in parallel in the J addressed memory locations of the J memory circuits, and
a detector configured to detect the possible presence of the at least one digital pattern, wherein the detector comprises an analyzer configured to analyze the accumulated values contained in the memory locations of the J memory circuits.

11. The device according to claim 10, wherein the analyzer is configured to:
determine the memory location for which the accumulated value is largest for each of the J memory circuits;
determine the average of the accumulated values contained in the other memory locations;
obtain a difference between a value taken from the largest cumulative value and the average, wherein J differences corresponding to the J memory circuits are obtained; and
compare the difference with a corresponding threshold.

12. The device according to claim 11, wherein the value is the largest cumulative value normalized by a number of times when a corresponding memory circuit of the J memory circuits has been fully addressed, and the average is the average of the cumulative values contained in the other memory locations, normalized by the number of times when the corresponding memory circuit has been fully addressed.

13. The device according to claim 11, wherein
obtaining each of the J differences less than the corresponding threshold, is representative of the absence of any pattern in the signal; and
obtaining one of the J differences greater than the corresponding threshold is representative of a presence in the signal of a pattern having a number of samples equal to a number of memory locations of the memory circuit for which the difference greater than the threshold has been obtained.

14. The device according to claim 10, wherein the carrier is a periodic signal having a carrier frequency, and the processing circuitry comprises:
a transposer configured to transpose the signal received into baseband on two channels in phase quadrature using the carrier frequency, and
a conversion stage configured to perform an analogue to digital conversion of two signals in phase quadrature so as to obtain to digital signals in baseband, wherein the analyzer is configured to determine the values indicative of the intensity of the signal, from the digital signals in baseband.

15. The device according to claim 10, wherein the signal originates from the carrier modulated by the on-off keying modulation by a first digital pattern belonging to the group of J reference patterns during a first modulation period, then by a second digital pattern belonging to the group of J reference patterns during a second modulation period, and wherein the device further comprises a controller configured to activate the processing circuitry for detecting the possible presence of the second digital pattern after detecting the possible presence of the first digital pattern.

16. The device according to claim 15, wherein a frequency of the carrier belongs to a set of different frequencies, and the controller is configured to activate the processing circuitry for each of the different frequencies so as to detect the possible presence of the at least one digital pattern and the frequency of the carrier.

17. The device according to claim 16, wherein in the event of obtaining several differences greater than the corresponding thresholds, the detector comprising a selector are configured to select the largest in order to designate the at least one pattern.

18. The device according to claim 15, wherein
a frequency of the carrier belongs to a set of different frequencies, and the controller is configured to activate the processing circuitry for each of the different frequencies so as to detect the possible presence of the at least one digital pattern and the frequency of the carrier; and
after having detected the possible presence of the first digital pattern and the frequency of the carrier, the controller is configured to activate the processing circuitry for the carrier frequency so as to detect the possible presence of the second digital pattern.

19. A circuit comprising:
a radio receiver configured to be coupled to an antenna, the radio receiver comprising demodulator configured to convert a signal received from the antenna to a baseband signal;
J memory circuits having respectively Nj memory locations; and
processing circuitry coupled to an output of the demodulator and to the memory circuits, the processing circuitry comprising:
an accumulator configured to
successively address the memory locations of the J memory circuits in a circular manner at frequency F and during an acquisition time, and
successively accumulate and store values indicative of a signal intensity of the baseband signal in parallel in the J addressed memory locations of the J memory circuits, and a detector configured to detect a possible presence of at least one digital pattern of the baseband signal, wherein the detector comprises an analyzer configured to analyze the accumulated values contained in the memory locations of the J memory circuits, wherein the at least one digital pattern belongs to a group of J reference patterns, J being greater than or equal to 2, comprising respectively Nj samples sequenced at a frequency F, and Nj being a different integer for each reference pattern.

20. The circuit of claim 19, further comprising an analogue-to-digital converter coupled between the demodulator and the processing circuitry.

* * * * *